(12) United States Patent
Nishimura

(10) Patent No.: US 7,746,145 B2
(45) Date of Patent: Jun. 29, 2010

(54) LEVEL SHIFT CIRCUIT CAPABLE OF PREVENTING OCCURRENCE OF MALFUNCTION WHEN LOW POWER SUPPLY FLUCTUATES, AND SEMICONDUCTOR INTEGRATED CIRCUIT INCLUDING THE CIRCUIT

(75) Inventor: Kazuya Nishimura, Ohsaka (JP)

(73) Assignee: Ricoh Company, Ltd., Tokyo (JP)

( * ) Notice: Subject to any disclaimer, the term of this patent is extended or adjusted under 35 U.S.C. 154(b) by 932 days.

(21) Appl. No.: 10/949,689

(22) Filed: Sep. 24, 2004

(65) Prior Publication Data
US 2007/0229137 A1 Oct. 4, 2007

(30) Foreign Application Priority Data
Sep. 25, 2003 (JP) ............................. 2003-333853

(51) Int. Cl.
*H03L 5/00* (2006.01)
(52) U.S. Cl. ............................. 327/333; 326/63; 326/81
(58) Field of Classification Search ................. 327/306, 327/333; 326/80–81, 62–63
See application file for complete search history.

(56) References Cited
U.S. PATENT DOCUMENTS
6,650,168 B1 * 11/2003 Wang et al. .................. 327/333
6,700,429 B2 * 3/2004 Kanno et al. ................. 327/333

FOREIGN PATENT DOCUMENTS
JP 3070373 5/2000

* cited by examiner

*Primary Examiner*—Dinh T. Le
(74) *Attorney, Agent, or Firm*—Cooper & Dunham LLP

(57) ABSTRACT

A level shift circuit includes two high-voltage PMOS, two high-voltage NMOS, and two low-voltage NMOS transistors. The first high-voltage PMOS is connected between a high voltage and a second output terminal, having a gate connected to a first output terminal. The second high-voltage PMOS is connected between the high voltage and the first terminal, having a gate connected to the second terminal. The first high-voltage NMOS is connected to the second terminal, having a gate through which a second signal is input. The first low-voltage NMOS is connected between the first high-voltage N-channel MOS and a ground, having a gate through which the second signal is input. The second high-voltage NMOS is connected to the first terminal, having a gate through which a first signal is input. The second low-voltage NMOS is connected between the second N-channel MOS and the ground, having a gate through which the first signal is input.

15 Claims, 6 Drawing Sheets

LEVEL SHIFT CIRCUIT CAPABLE OF PREVENTING OCCURRENCE OF MALFUNCTION WHEN LOW POWER SUPPLY FLUCTUATES, AND SEMICONDUCTOR INTEGRATED CIRCUIT INCLUDING THE CIRCUIT

BACKGROUND

1. Field

The present specification describes a level shift circuit, and more particularly a level shift circuit which is capable of preventing occurrence of malfunctions when a low power voltage supply fluctuates. The present specification further describes a semiconductor integrated circuit which includes the above-mentioned level shift circuit.

2. Discussion of the Background

FIG. 1 shows a conventional level shift circuit 101 and FIG. 2 shows its exemplary operation. As shown in FIG. 1, the level shift circuit 101 includes P-channel MOS (metal oxide semiconductor) transistors (hereinafter referred to as PMOS transistors) 111 and 113 and N-channel MOS transistors (hereinafter referred to as NMOS transistors) 112 and 114. The PMOS transistors 111 and 113 and the NMOS transistors 112 and 114 are pulled up to a predetermined low power voltage Vdd1. These transistors are designed to be used with a relatively low withstand voltage. The level shift circuit 101 further includes PMOS transistors 115 and 117 and NMOS transistors 116 and 118. The PMOS transistors 115 and 117 and the NMOS transistors 116 and 118 are pulled up to a predetermined high power voltage Vdd2. These PMOS transistors 115 and 117 and the NMOS transistors 116 and 118 are designed to have a relatively high withstand voltage and therefore have a threshold voltage greater than that of the PMOS transistors 111 and 113 and the NMOS transistors 112 and 114.

As shown in the operation of FIG. 2, when a signal Si at low level is input through an input terminal IN of the level shift circuit 101, a signal S1 at high level substantially equivalent to the predetermined low power voltage Vdd1 is input through a gate of the NMOS transistor 118 and a signal S2 at low level, that is, 0 volts, is input through a gate of the NMOS transistor 116. Alternately, when the signal Si at high level is input through the input terminal IN, the signal S1 at low level, that is, 0 volts, is input through the gate of the NMOS transistor 118 and the signal S2 at high level substantially equivalent to the predetermined low power voltage Vdd1 is input through the gate of the NMOS transistor 116.

Thus, the high level signal of the predetermined low power voltage Vdd1 is input through the gates of the NMOS transistors 116 and 118 which are pulled up to the predetermined high power voltage Vdd2. The voltage of the high level signal input through the gates of the NMOS transistors 116 and 118 are greater than threshold voltages VthB and VthA of the NMOS transistors 116 and 118. As a result, the NMOS transistors 116 and 118 can be switched to an ON state without fail, and signals level-shifted from the input signal Si are output through output terminals OUT and OUTB.

However, when the level of the predetermined low power voltage Vdd1 is reduced due to an influence of electrical noise or the like, the input signals at high level input to the gates of the NMOS transistors 116 and 118 become likely lower than the threshold voltages VthB and VthA of the NMOS transistors 116 and 118, as shown in FIG. 3. In this case, the NMOS transistors 116 and 118 cannot be switched to an ON state and, as a consequence, the level shift circuit 101 cannot properly perform its operation.

SUMMARY

This patent specification describes a novel level shift circuit capable of preventing occurrence of malfunctions when a low-power-voltage side reduces its voltage level. In one example, a novel level shift circuit which has a first power voltage and a second power voltage greater than the first power voltage, includes a differential circuit, first and second high-withstand-voltage P-channel MOS transistors, first and second high-withstand-voltage N-channel MOS depletion-type transistors, and first and second low-withstand-voltage N-channel MOS transistors. The differential circuit is pulled up to the first power voltage and is configured to convert a signal into a differential pair of first and second input signals alternatingly changing in amplitude within the first power voltage. The first high-withstand-voltage P-channel MOS transistor is connected between the second power voltage and a second output terminal and has a gate connected to a first output terminal. The second high-withstand-voltage P-channel MOS transistor is connected between the second power voltage and the first output terminal and has a gate connected to the second output terminal. The first high-withstand-voltage N-channel MOS depletion-type transistor is connected to the second output terminal and has a gate through which the second input signal is input. The first low-withstand-voltage N-channel MOS transistor is connected between the first high-withstand-voltage N-channel MOS depletion-type transistor and a ground and has a gate through which the second input signal is input. The second high-withstand-voltage N-channel MOS depletion-type transistor is connected to the first output terminal and has a gate through which the first input signal is input. The second low-withstand-voltage N-channel MOS transistor is connected between the second N-channel MOS depletion-type transistor and the ground and has a gate through which the first input signal is input.

Each of the first and second high-withstand-voltage P-channel MOS transistors and the first and second high-withstand-voltage N-channel MOS depletion-type transistors may have a withstand voltage greater than the second power voltage, and each of the first and second low-withstand-voltage N-channel MOS transistors may have a withstand voltage greater than the first power voltage.

Each of the first and second high-withstand-voltage P-channel MOS transistors and the first and second high-withstand-voltage N-channel MOS depletion-type transistors may have a withstand voltage greater than the second power voltage, and each of the first and second low-withstand-voltage N-channel MOS transistors may have a withstand voltage greater than the first power voltage and smaller than the second power voltage.

This patent specification describes a novel semiconductor integrated circuit capable of preventing occurrence of malfunctions when a low-power-voltage side reduces its voltage level. In one example, a novel semiconductor integrated circuit which has a first power voltage and a second power voltage greater than the first power voltage, includes a differential circuit, first and second high-withstand-voltage P-channel MOS transistors, first and second high-withstand-voltage N-channel MOS depletion-type transistors, and first and second low-withstand-voltage N-channel MOS transistors. The differential circuit is pulled up to the first power voltage and is configured to convert a signal into a differential pair of first and second input signals alternatingly changing in amplitude within the first power voltage. The first high-withstand-voltage P-channel MOS transistor is connected between the second power voltage and a second output terminal and has a gate connected to a first output terminal. The second high-withstand-voltage P-channel MOS transistor is connected between the second power voltage and the first output terminal and has a gate connected to the second output terminal. The first high-withstand-voltage N-channel MOS depletion-type transistor is connected to the second output terminal and has a gate input by the second input signal. The first low-withstand-voltage N-channel MOS transistor is connected between the first high-withstand-voltage N-channel MOS depletion-type transistor and a ground and has a gate input by the second input signal. The second high-withstand-voltage N-channel MOS depletion-type transistor is connected to the first output terminal and has a gate input by the first input signal. The second low-withstand-voltage N-channel MOS transistor is connected between the second N-channel MOS depletion-type transistor and the ground and has a gate input by the first input signal.

Each of the first and second high-withstand-voltage, P-channel MOS transistors and the first and second high-withstand-voltage N-channel MOS depletion-type transistors may have a withstand voltage greater than the second power voltage, and each of the first and second low-withstand-voltage N-channel MOS transistors may have a withstand voltage greater than the first power voltage.

Each of the first and second high-withstand-voltage P-channel MOS transistors and the first and second high-withstand-voltage N-channel MOS depletion-type transistors may have a withstand voltage greater than the second power voltage, and each of the first and second low-withstand-voltage N-channel MOS transistors may have a withstand voltage greater than the first power voltage and smaller than the second power voltage.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF PREFERRED EMBODIMENTS

Figure 1A:
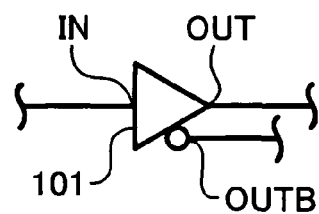
FIG. 1 is a circuit diagram of a conventional level shift circuit.

In describing preferred embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner. Referring now to the drawings, wherein like reference numerals designate identical or corresponding parts throughout the several views, particularly to FIG. 4, a level shift circuit 1 according to an exemplary embodiment of the present invention is explained.

Figure 4:
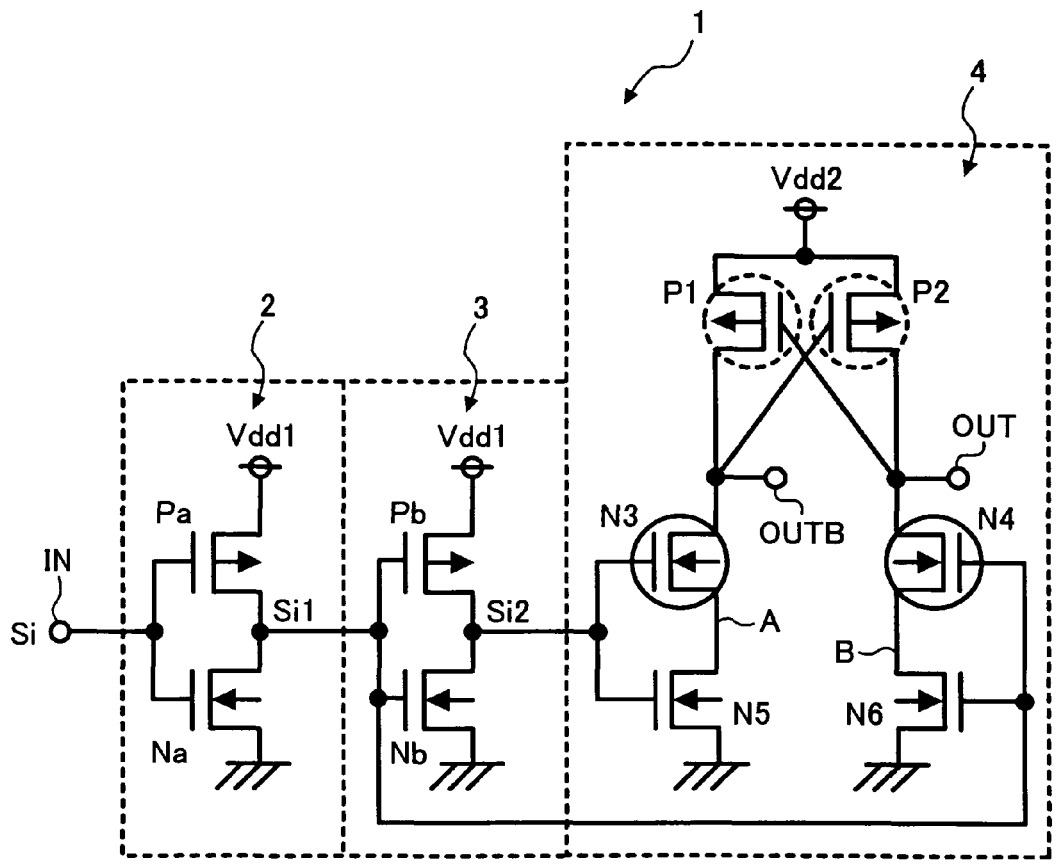
FIG. 4 is a circuit diagram of a level shift circuit according to an exemplary embodiment of the present application.

FIG. 4 shows the level shift circuit 1 according to an exemplary embodiment of the present invention. This circuit, as one example of the level shift circuit, is configured to convert an input digital signal into differential signals, to concurrently shift the levels of the differential signals, and to output the level-shifted signals. For accomplishing these operations, the level shift circuit 1 includes inverters 2 and 3 and a main circuit 4.

As shown in FIG. 4, the inverter 2 includes a P-channel MOS transistor Pa (hereinafter referred to as a PMOS transistor Pa) and an N-channel MOS transistor Na (hereinafter referred to as an NMOS transistor Na). The inverter 3 includes a P-channel MOS transistor Pb (hereinafter referred to as a PMOS transistor Pb) and an N-channel MOS transistor Nb (hereinafter referred to as an NMOS transistor Nb). The main circuit 4 includes P-channel MOS transistors P1 and P2 and N-channel MOS transistors N3, N4, N5, and N6.

In FIG. 4, a digital signal Si input through an input, terminal IN of the level shift circuit 1 is inverted by the inverter circuit 2 and an inverted signal Si1 output from the inverter circuit 2 is further inverted by an inverter circuit 3. The signal output from the inverter 2 is referred to as an output signal Si1 and the signal output from the inverter 3 is referred to as an output signal Si2. These two output signals Si1 and Si2 form a pair of differential signals and are input through the main circuit 4.

Each of the inverter circuits 2 and 3 is pulled up to a first predetermined power voltage Vdd1, which is a relatively low voltage. Each of the output signals Si1 and Si2 varies in amplitude within a range between the ground level and the first predetermined power voltage Vdd1. The main circuit 4 is pulled up to a second predetermined power voltage Vdd2 which is a relatively high voltage and is greater than the first predetermined power voltage Vdd1. The main circuit 4 shifts high level voltages of the output signals Si1 and Si2 up to the second predetermined power voltage Vdd2 and outputs the shifted signals from a pair of output terminals OUT and OUTB of the level shift circuit 1.

The PMOS transistors P1 and P2 of the main circuit 4 have a high withstand voltage greater than the second predetermined power voltage Vdd2. The NMOS transistors N3 and N4 are a depletion type transistor with a high withstand voltage. The NMOS transistors N5 and N6 have a low withstand voltage which is greater than the first predetermined power voltage Vdd1. In comparison with the NMOS transistors 116 and 118 of FIG. 1, the NMOS transistors N5 and N6 have a relatively smaller threshold voltage Vth. The depletion-type NMOS transistors N3 and N4 have a threshold voltage of from 0 volts to a minus few tenths of a volt.

The PMOS transistor P1 and the NMOS transistors N3 and N5 are connected in series between the second predetermined power voltage Vdd2 and ground, and the PMOS transistor P2 and the NMOS transistors N4 and N6 are also connected in the same way. The NMOS transistors N3 and N5 have gates connected to each other and through which the output signal Si2 from the inverter 3 is input. Similarly, the NMOS transistors N4 and N6 have gates connected to each other and through which the output signal Si1 from the inverter 2 is input. The gate of the PMOS transistor P1 is connected to a junction point between the PMOS transistor P2 and the NMOS transistor N4, and the junction forms the output terminal OUT. In a similar way, the gate of the PMOS transistor P1 and the NMOS transistor N3, and the junction forms the output terminal OUTB.

Figure 5:
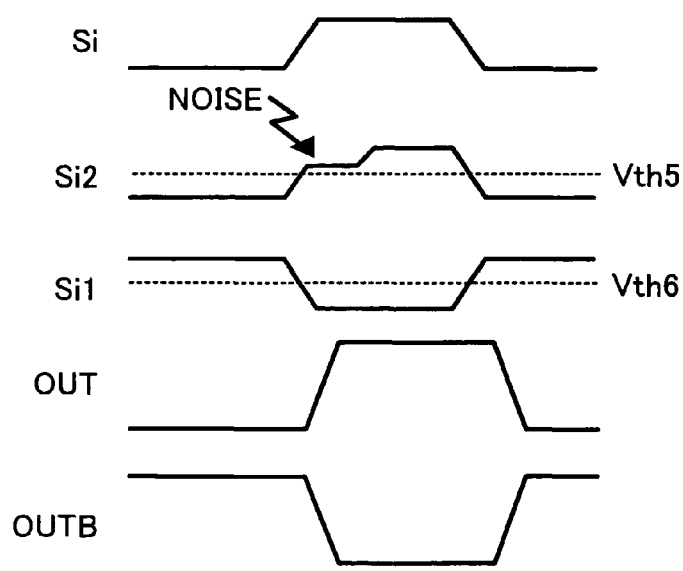
FIG. 5 is a time chart in an operation performed by the level shift circuit of FIG. 4.

With the above-described structure, the main circuit 4 performs its operation, such as illustrated in FIG. 5, for example, and more specifically, when the first predetermined power voltage Vdd1, which is the low power voltage, is lowered. Since the NMOS transistors N3 and N4 are of depletion type, they are constantly in an active state, that is, in an "ON" state. The NMOS transistors N5 and N6 will not malfunction even when their gate voltages at high level are varied by accident, that is, the voltages of the output signals Si1 and Si2 at high level are inadvertently reduced, as illustrated in FIG. 5, since the threshold voltages of the NMOS transistors N5 and N6 are sufficiently small.

Although the NMOS transistors N5 and N6 are the transistors of the low withstand voltage, they will not suffer a voltage exceeding their withstand voltage. More specifically, when the gate voltages of the NMOS transistors N3 and N5 are 0 volts, the PMOS transistor P1 is switched to an ON state and the NMOS transistors N3 and N5 are switched to an OFF state since the NMOS transistors N4 and N6 receive, through their gates, the output signal Si1 at high level which is substantially equal to the first predetermined power voltage Vdd1. Under this circumstance, a difference between a gate voltage Vg3 and a threshold voltage Vth3 of the NMOS transistor N3, that is, (Vg3−Vth3) is about a few tenths of a volt. This far smaller voltage than the withstand voltage of the NMOS transistor N5 appears on a junction A between the NMOS transistors N3 and N5.

Similarly, when the gate voltages of the NMOS transistors N4 and N6 are 0 volts, the PMOS transistor P2 is switched to an ON state and the NMOS transistors N4 and N6 are switched to an OFF state since the NMOS transistors N3 and N5 receive, through their gates, the output signal Si2 at high level which is substantially equal to the first predetermined power voltage Vdd1. Under this circumstance, a difference between a gate voltage Vg4 and a threshold voltage Vth4 of the NMOS transistor N4, that is, (Vg4−Vth4) is about a few tenths of a volt. This far smaller voltage than the withstand voltage of the NMOS transistor N6 is appearing on a junction B between the NMOS transistors N4 and N6.

When the output signal Si2 at high level, which is substantially equal to the first predetermined power voltage Vdd1, is applied to the gates of the NMOS transistors N3 and N5, the NMOS transistors N3 and N5 are switched to an ON state and, at the same time, the PMOS-transistor P1 is switched to an OFF state since the output signal Si1 at 0 volts, that is, at low level, is applied to the gates of the NMOS transistors N4 and N6. Consequently, the output terminal OUTB is 0 volts, that is, low level which brings the junction A to 0 volts. Therefore, the NMOS transistor N5 will not suffer a voltage exceeding its withstand voltage.

Similarly, when the output signal Si1 at high level, which is substantially equal to the first predetermined power voltage Vdd1, is applied to the gates of the NMOS transistors N4 and N6, the NMOS transistors N4 and N6 are switched to an ON state and, at the same rime, the PMOS transistor P2 is switched to an OFF state since the output signal Si2 at 0 volts, that is, at low level, is applied to the gates of the NMOS transistors N3 and N5. Consequently, the output terminal OUT is 0 volts, that is, low level which brings the junction B to 0 volts. Therefore, the NMOS transistor N6 will not suffer a voltage exceeding its withstand voltage.

Figure 6:
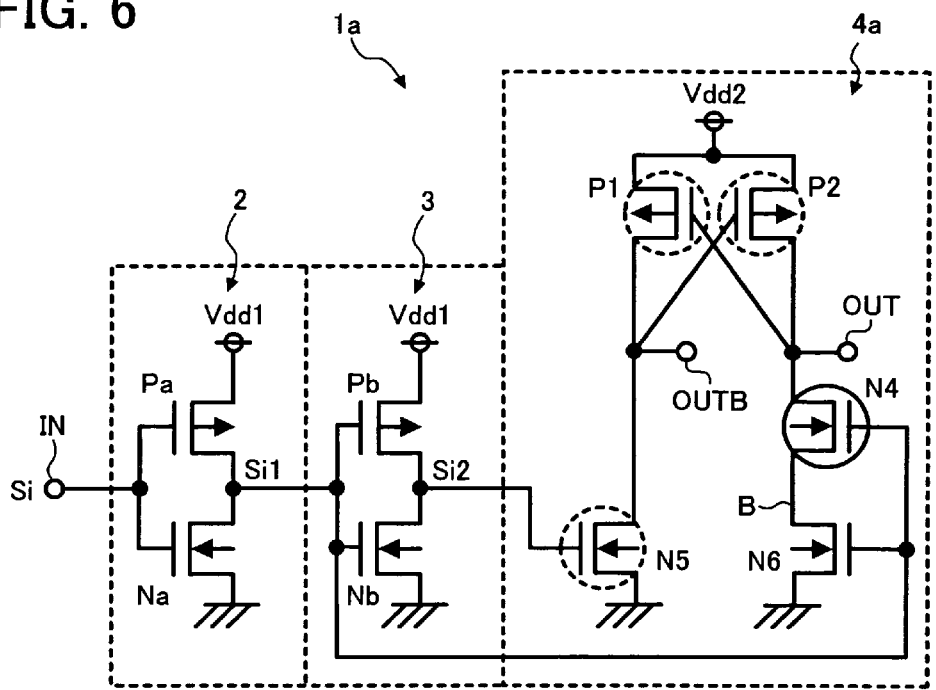
FIGS. 6-8 are circuit diagrams of alternative level shift circuits to the level shift circuit of FIG. 4.

FIG. 6 shows a level shift circuit 1a according to another embodiment of the present invention. The level shift circuit 1a of FIG. 6 is similar to the level shift circuit 1 of FIG. 4, except that the NMOS transistor N3 is omitted. With the NMOS transistor N3 omitted, the PMOS transistor P1 and the NMOS transistor N5 are directly connected in series between the second predetermined power voltage Vdd2 and the ground. This omission of the NMOS transistor N3 is to prevent a malfunction caused by high level noises of the output signal Si1 sent from the inverter 2. In this case, the output signal Si2 from the inverter 3 is applied only to the gate of the NMOS transistor N5 which is therefore needed to have a high withstand voltage.

Figure 7:
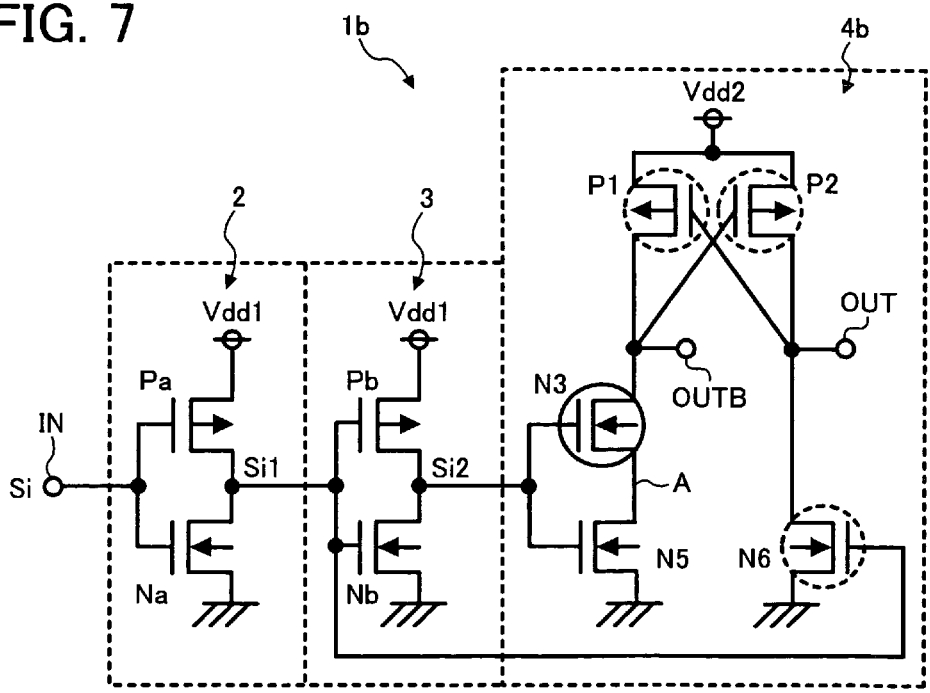

Also, FIG. 7 shows a level shift circuit 1b according to another embodiment of the present invention. The level shift circuit 1b of FIG. 7 is similar to the level shift circuit 1 of FIG. 4, except that the NMOS transistor N4 is omitted. With the NMOS transistor N4 omitted, the PMOS transistor P2 and the NMOS transistor N6 are directly connected in series between the second predetermined power voltage Vdd2 and the ground. This omission of the NMOS transistor N4 is to prevent a malfunction caused by high level noises of the output signal Si2 sent from the inverter 3. In this case, the output signal Si1 from the inverter 2 is applied only to the gate of the NMOS transistor N6 which is therefore needed to have a high withstand voltage.

In these ways, as illustrated in FIGS. 6 and 7, a number of transistors can be reduced from the respective level shift circuits.

Figure 8:
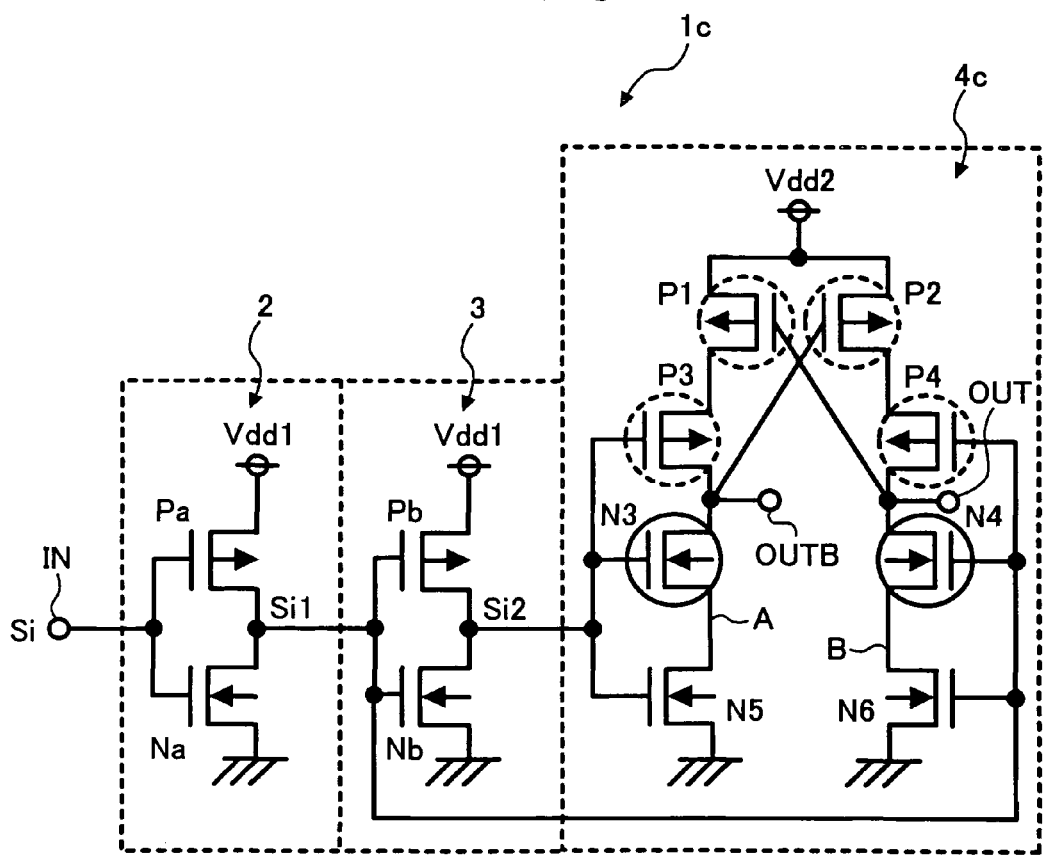

FIG. 8 shows a level shift circuit 1c according to another embodiment of the present invention. The level shift circuit 1c of FIG. 8 is similar to the level shift circuit 1b of FIG. 4, except for additional PMOS transistors P3 and P4. With the addition of the PMOS transistor P3, the PMOS transistors P1 and P3 and the NMOS transistors N3 and N5 are connected in series between the second predetermined power voltage Vdd2 and the ground, and the output signal Si2 is applied to the gates of the PMOS transistor P3 and the NMOS transistors N3 and N5. Also, with the addition of the PMOS transistor P4, the PMOS transistors P2 and P4 and the NMOS transistors N4 and N6 are connected in series between the second predetermined power voltage Vdd2, and the output signal Si1 is applied to the gates of the PMOS transistor P4 and the NMOS transistors N4 and N6.

This structure of the level shift circuit 1c shown in FIG. 8 prevent flow-through currents which are generated in the level shift circuit 1 of FIG. 4 flowing from the second predetermined power voltage Vdd2 to the ground through the direct circuits of the PMOS transistor P1 and the NMOS transistors N3 and N5 and of the PMOS transistor P2 and the NMOS transistors N4 and N6.

In these ways, the main circuit of the level shift circuit can prevent the generation of the flow-through current.

Figure 1B:
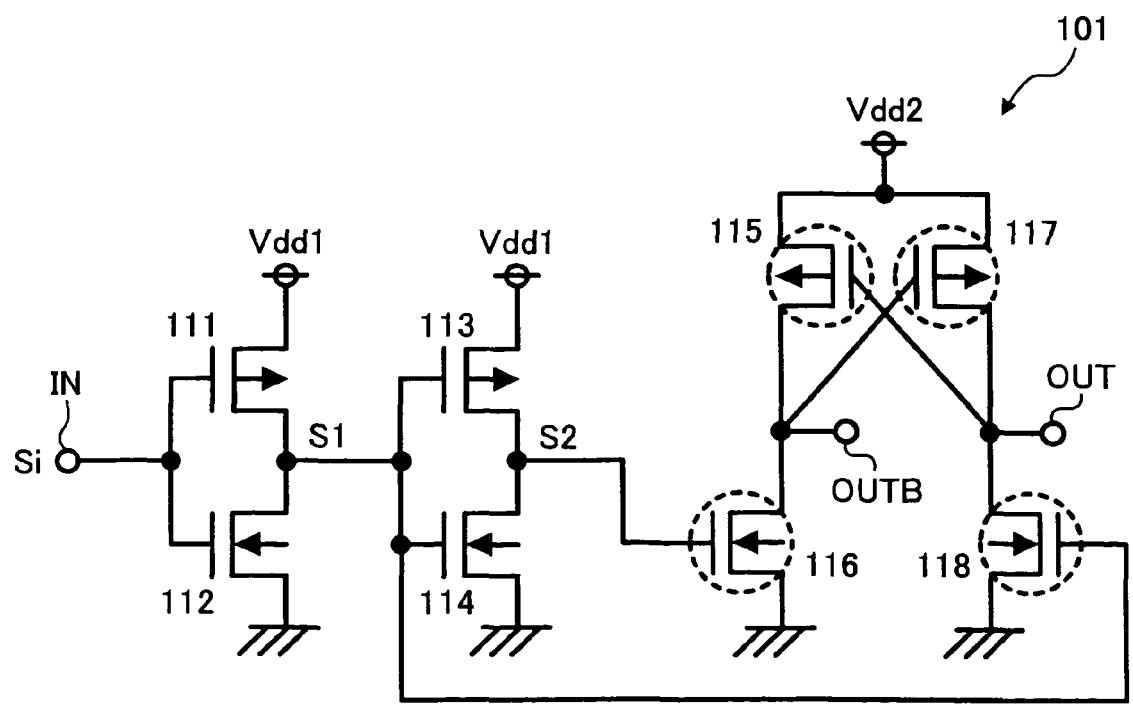
Figure 2:
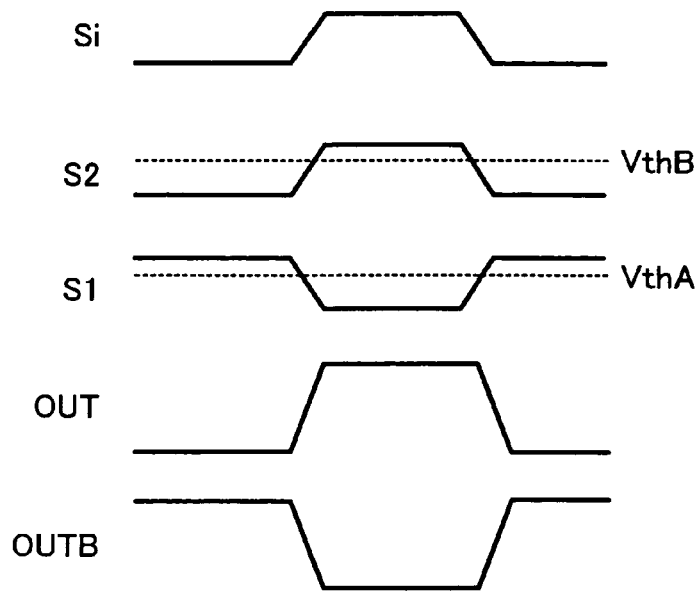
FIG. 2 is a time chart in an operation performed by the shift level circuit of FIG. 1.
Figure 3:
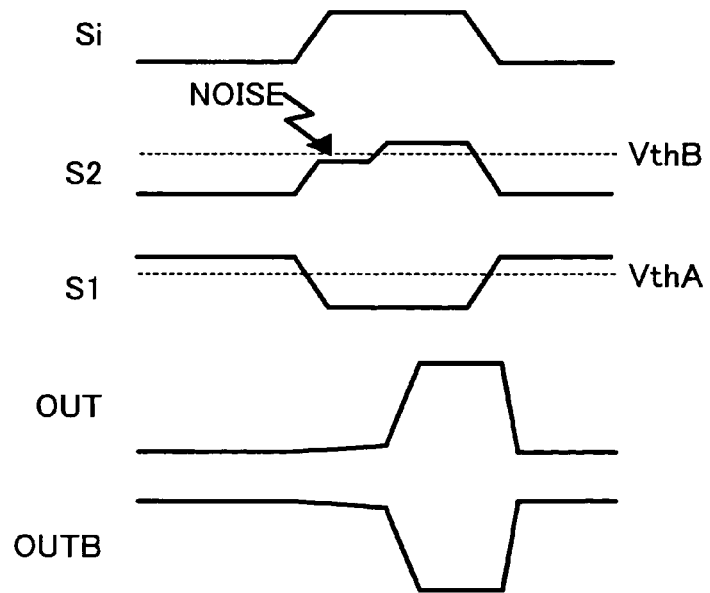
FIG. 3 is a time chart in an erroneous operation performed by the shift level circuit of FIG. 1.

The flow-though current may be generated also in the level shift circuits 1a of FIG. 6 and 1b of FIG. 7 but in a manner similar to the level shift circuit 1 of FIG. 4 and therefore a repetitive explanation for the flow-through current is avoided.

Figure 9:
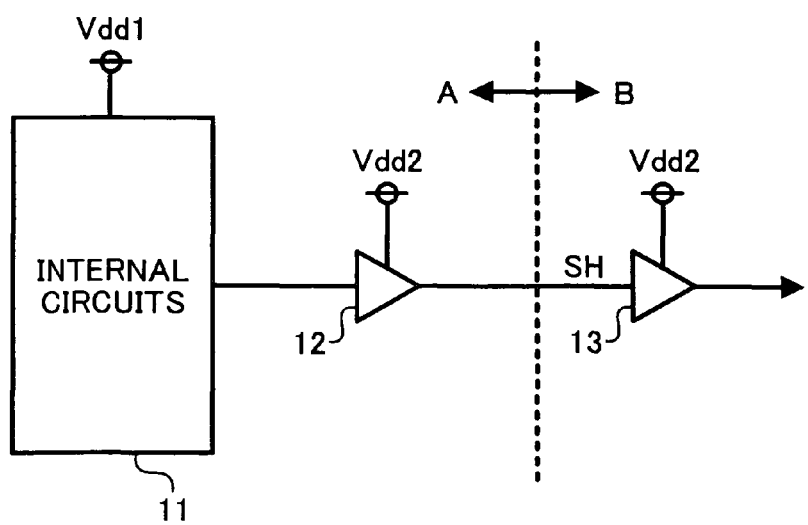
FIGS. 9-11 are circuit diagrams of exemplary applications in which the level shift circuit of FIG. 4 can be used.
Figure 10:
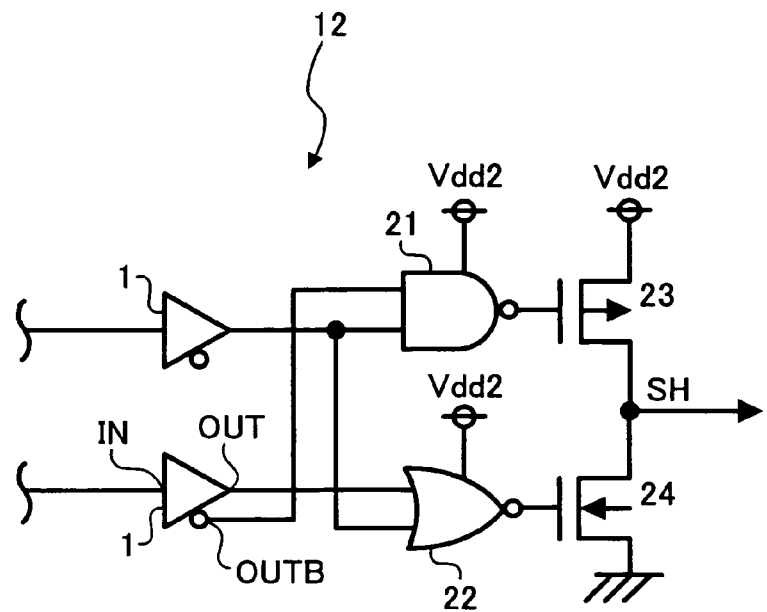
Figure 11:
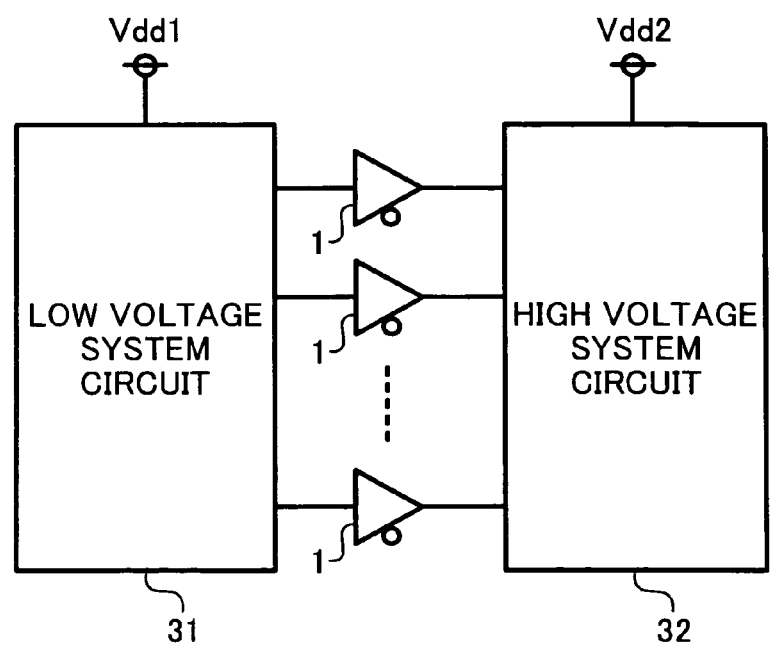

Referring to FIGS. 9-11, an exemplary application of the level shift circuit 1 of FIG. 4 is explained. FIG. 9, shows an exemplary electrical apparatus which outputs to an external circuit 13 a signal SH having a voltage greater than the first predetermined power voltage used by an internal circuit 11 of the electrical apparatus. To achieve this feature, a semiconductor integrated circuit side of the electrical apparatus includes, as shown in FIG. 10, an output circuit 12 which includes the level shift circuits 1 of FIG. 4, a logical NAND gate 21, a logical NOR gate 22, a PMOS transistor 23, and an NMOS transistor 24. As described above, the level shift circuit 1 converts a signal generated in a supply power system of the first predetermined power voltage Vdd1 into a signal (i.e., the signal SH) controlled in a supply power system of the second predetermined power voltage Vdd2 greater than the first predetermined power voltage Vdd1.

Also, as shown in FIG. 11, the level shift circuit 1 of FIG. 4 is used in a semiconductor integrated circuit which includes a low voltage circuit system 31 using the first predetermined power voltage Vdd1 and a high voltage circuit system 32 using the second predetermined power voltage Vdd2. In this semiconductor integrated circuit of FIG. 11, the low voltage circuit system 31 and the high voltage circuit system 32 use different power voltage systems and a plurality of the level shift circuits 1 are employed to shift the voltage levels of the signals output from the low voltage circuit system 31 to the high voltage circuit system 32.

Numerous additional modifications and variations are possible in light of the above teachings. It is therefore to be understood that within the scope of the appended claims, the disclosure of this patent-specification may be practiced otherwise than as specifically described herein.

This patent specification is based on Japanese patent applications No. JPAP2003-333853 filed on Sep. 25, 2003 in the Japanese Patent Office, the entire contents of which are incorporated by reference herein.

What is claimed is:

1. A level shill circuit having a first power voltage and a second power voltage greater than the first power voltage, the level shill circuit comprising:
    a differential circuit pulled up to the first power voltage and configured to convert a signal into a differential pair of first and second input signals alternatingly changing in amplitude within the first power voltage;
    a first high-withstand-voltage P-channel MOS transistor connected between the second power voltage and a second output terminal and having a gate connected to a first output terminal;
    a second high-withstand-voltage P-channel MOS transistor connected between the second power voltage and the first output terminal and having a gate connected to the second output terminal;
    a first high-withstand-voltage N-channel MOS transistor having a drain connected to the second output terminal and a source connected directly to a ground, and having a gate through which the second input signal is input;
    a second high-withstand-voltage N-channel MOS depletion-type transistor connected to the first output terminal and having a gate through which the first input signal is input; and
    a second low-withstand-voltage N-channel MOS transistor connected between the second N-channel MOS depiction-type transistor and the ground and having a gate through which the first input signal is input,
    wherein the second high-withstand-voltage N-channel MOS depletion-type transistor has a threshold voltage less than 0 volts.

2. A level shift circuit of claim 1, wherein each of the first and second high-withstand-voltage P-channel MOS transistors and the second high-withstand-voltage N-channel MOS depletion-type transistor has a withstand voltage greater than the second power voltage, and each of the first high-withstand-voltage N-channel MOS transistor and the second low-withstand-voltage N-channel MOS transistor has a withstand voltage greater than the first power voltage.

3. A level shift circuit of claim 1, wherein each of the first and second high-withstand-voltage P-channel MOS transistors and the second high-withstand-voltage N-channel MOS depletion-type transistors has a withstand voltage greater than the second power voltage, and the second low-withstand-voltage N-channel MOS transistor has a withstand voltage greater than the first power voltage and smaller than the second power voltage.

4. The level shift circuit of claim 1, wherein the source of the first high-withstand-voltage N-channel MOS transistor has a potential of approximately 0 volts.

5. The level shill circuit of claim 1, wherein there are no transistors connected between the source of the first high-withstand-voltage N-channel MOS transistor and the ground.

6. The level shift circuit of claim 1, wherein there is no potential drop between the source of the first high-withstand-voltage N-channel MOS transistor and the ground.

7. A level shift circuit having a first power voltage and a second power voltage greater than the first power voltage, the level shift circuit comprising:
    a differential circuit pulled up to the first power voltage and configured to convert a signal into a differential pair of first and second input signals alternatingly changing in amplitude within the first power voltage;
    a first high-withstand-voltage P-channel MOS transistor connected between the second power voltage and a second output terminal and having a gate connected to a first output terminal;
    a second high-withstand-voltage P-channel MOS transistor connected between the second power voltage and the first output terminal and having a gate connected to the second output terminal;
    a first high-withstand-voltage N-channel MOS depletion-type transistor connected to the second output terminal and having a gate through which the second input signal is input;
    a first low-withstand-voltage N-channel MOS transistor connected between the first high-withstand-voltage N-channel MOS depletion-type transistor and a ground and having a gate through which the second input signal is input; and
    a second high-withstand-voltage N-channel MOS transistor having a drain connected to the first output terminal and a source connected directly to the ground, and having a gate through which the first input signal is input,
    wherein the first high-withstand-voltage N-channel MOS depletion-type transistor has a threshold voltage less than 0 volts.

8. A level shift circuit of claim 7, wherein each of the first and second high-withstand-voltage P-channel MOS transistors and the first high-withstand-voltage N-channel MOS depletion-type transistors has a withstand voltage greater than the second power voltage, and each of the first low-withstand-voltage N-channel MOS transistor and the second high-withstand-voltage N-channel MOS transistor has a withstand voltage greater than the first power voltage.

9. A level shift circuit of claim 7, wherein each of the first and second high-withstand-voltage P-channel MOS transistors and the first high-withstand-voltage N-channel MOS depletion-type transistors has a withstand voltage greater than the second power voltage, and the first-withstand-voltage N-channel MOS transistor has a withstand voltage greater than the first power voltage and smaller than the second power voltage.

10. A semiconductor integrated circuit having a first power voltage and a second power voltage greater than the first power voltage, the semiconductor integrated circuit comprising:
    a differential circuit pulled up to the first power voltage and configured to convert a signal into a differential pair of first and second input signals alternatingly changing in amplitude within the first power voltage;

a first high-withstand-voltage P-channel MOS transistor connected between the second power voltage and a second output terminal and having a gate connected to a first output terminal;

a second high-withstand-voltage P-channel MOS transistor connected between the second power voltage and the first output terminal and having a gate connected to the second output terminal;

a first high-withstand-voltage N-channel MOS transistor having a drain connected to the second output terminal and a source connected directly to a ground, and having a gate through which the second input signal is input;

a second high-withstand-voltage N-channel MOS depletion-type transistor connected to the first output terminal and having a gate through which the first input signal is input; and a second low-withstand-voltage N-channel MOS transistor connected between the second N-channel MOS depletion-type transistor and the ground and having a gate through which the first input signal is input, wherein the second high-withstand-voltage N-channel MOS depletion-type transistor has a threshold voltage less than 0 volts.

11. A semiconductor integrated circuit of claim 10, wherein each of the first and second high-withstand-voltage P-channel MOS transistors and the second high-withstand-voltage N-channel MOS depletion-type transistor has a withstand voltage greater than the second power voltage, and each of the first high-withstand-voltage N-channel MOS transistor and the second low-withstand-voltage N-channel MOS transistor has a withstand voltage greater than the first power voltage.

12. A semiconductor integrated circuit of claim 10, wherein each of the first and second high-withstand-voltage P-channel MOS transistors and the second high-withstand-voltage N-channel MOS depletion-type transistors has a withstand voltage greater than the second power voltage, and the second low-withstand-voltage N-channel MOS transistor has a withstand voltage greater than the first power voltage and smaller than the second power voltage.

13. A semiconductor integrated circuit having a first power voltage and a second power voltage greater than the first power voltage, the semiconductor integrated circuit comprising:

a differential circuit pulled up to the first power voltage and configured to convert a signal into a differential pair of first and second input signals alternatingly changing in amplitude within the first power voltage;

a first high-withstand-voltage P-channel MOS transistor connected between the second power voltage and a second output terminal and having a gate connected to a first output terminal;

a second high-withstand-voltage P-channel MOS transistor connected between the second power voltage and the first output terminal and having a gate connected to the second output terminal;

a first high-withstand-voltage N-channel MOS depletion-type transistor connected to the second output terminal and having a gate through which the second input signal is input;

a first low-withstand-voltage N-channel MOS transistor connected between the first high-withstand-voltage N-channel MOS depletion-type transistor and a ground and having a gate through which the second input signal is input; and a second high-withstand-voltage N-channel MOS transistor having a drain connected to the first output terminal and a source connected directly to the ground, and having a gate through which the first input signal is input;

wherein the first high-withstand-voltage N-channel MOS depletion-type transistor has a threshold voltage less than 0 volts.

14. A semiconductor integrated circuit of claim 13, wherein each of the first and second high-withstand-voltage P-channel MOS transistors and the first high-withstand-voltage N-channel MOS depletion-type transistors has a withstand voltage greater than the second power voltage, and each of the first low-withstand-voltage N-channel MOS transistor and the second high-withstand-voltage N-channel MOS transistor has a withstand voltage greater than the first power voltage.

15. A semiconductor integrated circuit of claim 13, wherein each of the first and second high-withstand-voltage P-channel MOS transistors and the first high-withstand-voltage N-channel MOS depletion-type transistors has a withstand voltage greater than the second power voltage, and the first low-withstand-voltage N-channel MOS transistor has a withstand voltage greater than the first power voltage and smaller than the second power voltage.

* * * * *